(12) United States Patent
Boone et al.

(10) Patent No.: US 12,628,270 B2
(45) Date of Patent: May 12, 2026

(54) DIMPLE ON CIRCUIT BOARD FOR PROVIDING STANDOFF BETWEEN CIRCUIT BOARD AND CIRCUIT PACKAGE

(71) Applicant: Dell Products L.P., Round Rock, TX (US)

(72) Inventors: Earl Boone, Round Rock, TX (US); James L. Petivan, Austin, TX (US); Wallace H. Ables, Georgetown, TX (US); Steven R. Ethridge, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 211 days.

(21) Appl. No.: 18/502,914

(22) Filed: Nov. 6, 2023

(65) Prior Publication Data

US 2025/0151191 A1 May 8, 2025

(51) Int. Cl.
| | |
|---|---|
| *H05K 1/11* | (2006.01) |
| *H05K 1/02* | (2006.01) |
| *H05K 3/04* | (2006.01) |
| *H05K 3/341* | (2026.01) |
| *H05K 1/181* | (2026.01) |

(52) U.S. Cl.
CPC ........... *H05K 1/0284* (2013.01); *H05K 1/111* (2013.01); *H05K 3/04* (2013.01); *H05K 3/3436* (2013.01); *H05K 1/181* (2013.01); *H05K 2201/09045* (2013.01); *H05K 2201/09381* (2013.01); *H05K 2201/0939* (2013.01); *H05K 2201/2036* (2013.01)

(58) Field of Classification Search
CPC .... H05K 1/0284; H05K 1/111; H05K 3/0044; H05K 3/04; H05K 1/181; H05K 3/3431; H05K 2201/09045; H05K 2201/09381; H05K 2201/0939; H05K 2201/2036; H05K 3/3436; H05K 2201/09063; H05K 2201/09036
See application file for complete search history.

(56) References Cited

U.S. PATENT DOCUMENTS

| | | | | | |
|---|---|---|---|---|---|
| 4,605,153 | A | * | 8/1986 | Van Den Brekel .. | H05K 3/3485 228/56.3 |
| 5,759,910 | A | * | 6/1998 | Mangold ................. | H01L 24/11 257/E23.021 |
| 6,137,063 | A | * | 10/2000 | Jiang ...................... | H05K 3/323 361/767 |
| 6,313,999 | B1 | * | 11/2001 | Fratti ................... | H05K 3/3436 324/750.25 |
| 6,433,426 | B1 | * | 8/2002 | Ikegami ............ | H01L 23/49811 257/781 |
| 6,583,517 | B1 | * | 6/2003 | Jimarez ................... | H01L 24/16 257/781 |
| 6,624,512 | B2 | * | 9/2003 | Kurusu .................. | H05K 1/111 257/730 |
| 2009/0243092 | A1 | * | 10/2009 | Nishimura ............ | H10W 76/40 257/737 |

(Continued)

*Primary Examiner* — Steven T Sawyer
(74) *Attorney, Agent, or Firm* — Jackson Walker L.L.P.

(57) ABSTRACT

An information handling resource may include a circuit board comprising an electrically-conductive pad and a dimple formed on the circuit board, the dimple having a depression surrounded by a raised perimeter raised above a surface of the circuit board.

21 Claims, 4 Drawing Sheets

(56) References Cited

U.S. PATENT DOCUMENTS

| 2015/0009645 A1* | 1/2015 | Kaneko | ................ H05K 3/4007 |
| | | | 361/767 |
| 2016/0240467 A1* | 8/2016 | Yoshida | ............ H01L 23/49811 |
| 2018/0368259 A1* | 12/2018 | Kumar | .................. H01R 12/72 |
| 2025/0056710 A1* | 2/2025 | Xu | ....................... H05K 1/0274 |

* cited by examiner

DIMPLE ON CIRCUIT BOARD FOR PROVIDING STANDOFF BETWEEN CIRCUIT BOARD AND CIRCUIT PACKAGE

TECHNICAL FIELD

The present disclosure relates in general to information handling systems, and more particularly to systems and methods for improving solder joint reliability and reduction of voids in an interface between a circuit board and a package mounted thereto, in particular one or more dimples formed on a surface of a circuit board that act as standoffs between a circuit board and the package after a solder reflow process.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems may often use one or more circuit boards. A circuit board may comprise a substrate of a plurality of conductive layers separated and supported by layers of insulating material laminated together, with conductive traces disposed on and/or in any of such conductive layers, with vias for coupling conductive traces of different layers together, and with pads for coupling electronic components (e.g., packaged integrated circuits, slot connectors, etc.) to conductive traces of the circuit board.

In some instances, one or more integrated circuit packages may be mounted upon the circuit board. For example, using traditional approaches, solder bumps may be placed atop pads of a circuit board, and pins of an integrated circuit package and associated with the pads may be aligned with the solder bumps and placed in contact with the solder bumps. During a solder reflow process, the circuit board, pads, and solder bumps may be subjected to heat, melting the solder bumps such that when the heat is removed, the solder bumps provide mechanical strength to electrically couple the pins of the integrated circuit package to their corresponding circuit board pads.

In some instances, integrated circuit packages may be implemented using a bottom terminated component (BTC), such as a quad flat no-lead (QFN) package. Existing screen-printing solder technology produces a solder joint between a BTC and a circuit board of about 1.0 to 1.5 mils (wherein 1.0 mil equals one-thousandth of an inch). However, increasing solder joint height to 2.0 to 3.0 mils may improve solder joint reliability and allow flux residue to escape the solder joint during reflow in order to minimize voids.

SUMMARY

In accordance with the teachings of the present disclosure, the disadvantages and problems associated with existing approaches to mounting a circuit package to a printed circuit board may be reduced or eliminated.

In accordance with embodiments of the present disclosure, an information handling resource may include a circuit board comprising an electrically-conductive pad and a dimple formed on the circuit board, the dimple having a depression surrounded by a raised perimeter raised above a surface of the circuit board.

In accordance with these and other embodiments of the present disclosure, an information handling system may include a processor and an information handling resource comprising a circuit board comprising an electrically-conductive pad and a dimple formed on a surface of the circuit board, the dimple having a depression surrounded by a raised perimeter raised above a surface of the circuit board.

In accordance with these and other embodiments of the present disclosure a method may include forming a circuit board with an electrically-conductive pad and forming a dimple on the circuit board, the dimple having a depression surrounded by a raised perimeter raised above a surface of the circuit board.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
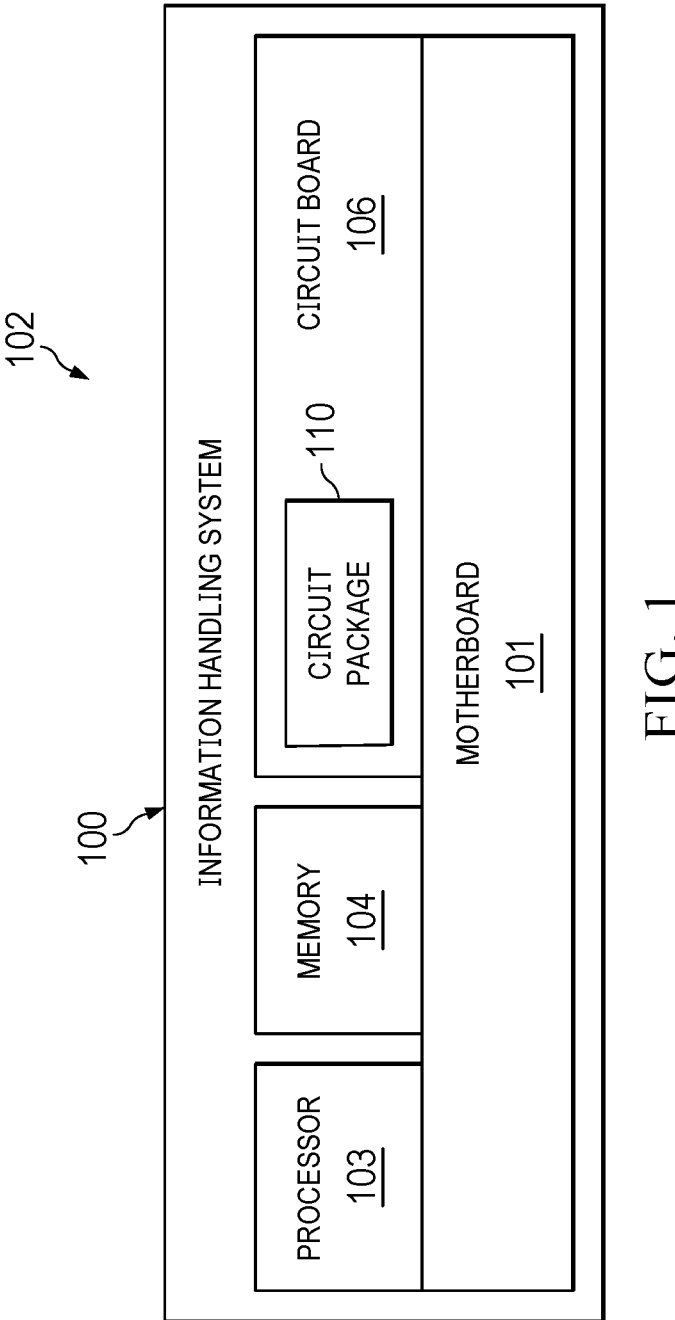
FIG. 1 illustrates a block diagram of selected components of an example information handling system, in accordance with embodiments of the present disclosure.

Preferred embodiments and their advantages are best understood by reference to FIGS. 1 through 4 wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and vary in size, shape, performance, functionality, and price. The information handling system may include memory, one or more processing resources such as a central processing unit ("CPU"), microcontroller, or hardware or software control logic. Additional components of the information handling system may include one or storage one more devices, or more communications ports for communicating with external devices as well as various input/output ("I/O") devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems (BIOSs), buses, memories, I/O devices and/or interfaces, storage resources, network interfaces, motherboards, and/or any other components and/or elements of an information handling system.

For the purposes of this disclosure, circuit boards may broadly refer to printed circuit boards (PCBs), printed wiring boards (PWBs), printed wiring assemblies (PWAs), etched wiring boards, and/or any other board or similar physical structure operable to mechanically support and electrically couple electronic components (e.g., packaged integrated circuits, slot connectors, etc.). A circuit board may comprise a substrate of a plurality of conductive layers separated and supported by layers of insulating material laminated together, with conductive traces disposed on and/or in any of such conductive layers, with vias for coupling conductive traces of different layers together, and with pads for coupling electronic components (e.g., packaged integrated circuits, slot connectors, etc.) to conductive traces of the circuit board.

FIG. 1 illustrates a block diagram of selected components of an example information handling system 102. In some embodiments, information handling system 102 may comprise a server. In other embodiments, information handling system 102 may comprise networking equipment for facilitating communication over a communication network. In yet other embodiments, information handling system 102 may comprise a personal computer, such as a laptop, notebook, or desktop computer.

As shown in FIG. 1, information handling system 102 may include a chassis 100 that houses a motherboard 101, a processor 103 coupled to motherboard 101, a memory 104 coupled to motherboard 101, a circuit board 106 mechanically and electrically coupled to motherboard 101, and a circuit package 110 mounted on circuit board 106.

Chassis 100 may include any suitable housing or enclosure configured to house the various components of information handling system 102, and may be constructed from metal, plastic, and/or any other suitable material.

Motherboard 101 may comprise a circuit board configured to provide structural support for one or more information handling resources of information handling system 102 and/or electrically couple one or more of such information handling resources to each other and/or to other electric or electronic components external to information handling system 102.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in a storage resource, memory system 104, and/or another component of information handling system 102.

Memory 104 may be communicatively coupled to processor 103 and may comprise any system, device, or apparatus operable to retain program instructions or data for a period of time (e.g., computer-readable media). Memory 104 may comprise random access memory (RAM), electrically erasable programmable read-only memory (EE-PROM), a PCMCIA card, flash memory, magnetic storage, opto-magnetic storage, or any suitable selection and/or array of volatile or non-volatile memory that retains data after power to information handling system 102 is turned off. In particular embodiments, memory 104 may comprise dynamic random access memory (DRAM).

Circuit board 106 may comprise any suitable circuit board. As shown in FIG. 1, a circuit package 110 may be mounted upon circuit board 106. In some embodiments, circuit package 110 may comprise an integrated circuit package. In these and other embodiments, circuit package 110 may comprise a BTC, such as a QFN package.

In addition to motherboard 101, processor 103, memory 104, circuit board 106, and circuit package 110, information handling system 102 may include one or more other information handling resources.

Figure 2:
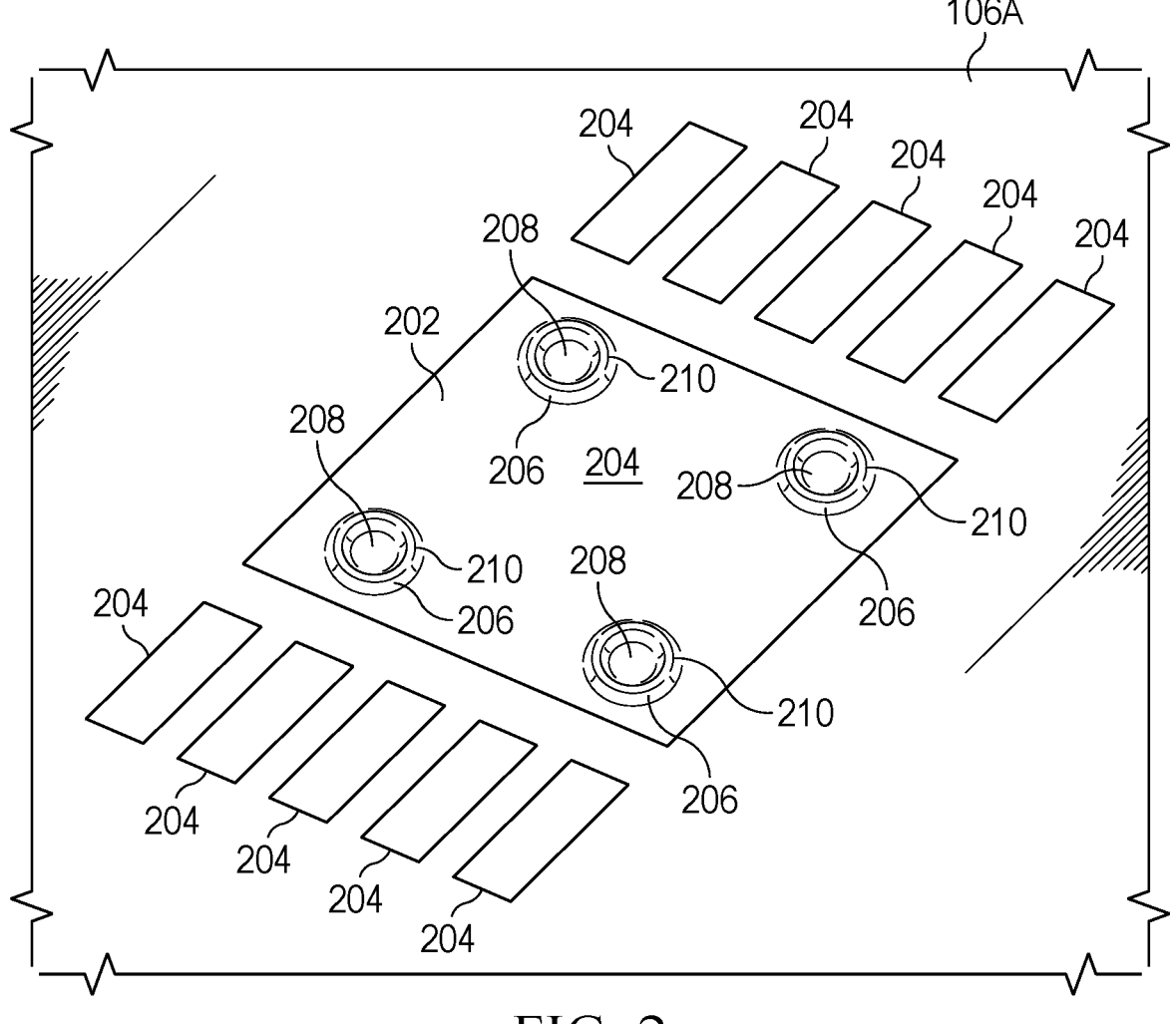
FIG. 2 illustrates a perspective view of selected components of an example circuit board, in accordance with embodiments of the present disclosure.

FIG. 2 illustrates a perspective view of selected components of an example circuit board 106A in accordance with embodiments of the present disclosure. In some embodiments, circuit board 106A depicted in FIG. 2 (and FIG. 3) may be used to implement circuit board 106 shown in FIG. 1.

As shown in FIG. 2, circuit board 106A may include a plurality of pads 204 for electrically coupling circuit packages to circuit board 106A. Also as shown in FIG. 2, circuit board 106 may have one or more dimples 206 formed on a surface 202 of a pad 204 of circuit board 106A. A dimple 206 may have a depression 208 in the center of dimple 206, which may penetrate below surface 202, and a raised perimeter 210 around depression 208, which may be raised above surface 202. In some embodiments, raised perimeter 210 may be raised above surface 202 by between approximately 2.0 mils and 4.0 mils. Although each dimple 206 is shown in FIG. 2 as being circular in shape, a dimple 206 may have any suitable shape, whether a regular or irregular shape. Further, a dimple 206 may have any suitable physical dimensions (e.g., diameter, length, width, height, etc).

A dimple 206 may be formed in any suitable manner upon surface 202. For example, in some embodiments, a mechanical punch tool (e.g., an automatic machine, or a manual tool such as a ball peen hammer and a punch tool) may be used prior to a solder reflow process of circuit board 106A that applies a force to surface 202 sufficient to create depression 208 and raised perimeter 210.

Figure 3:
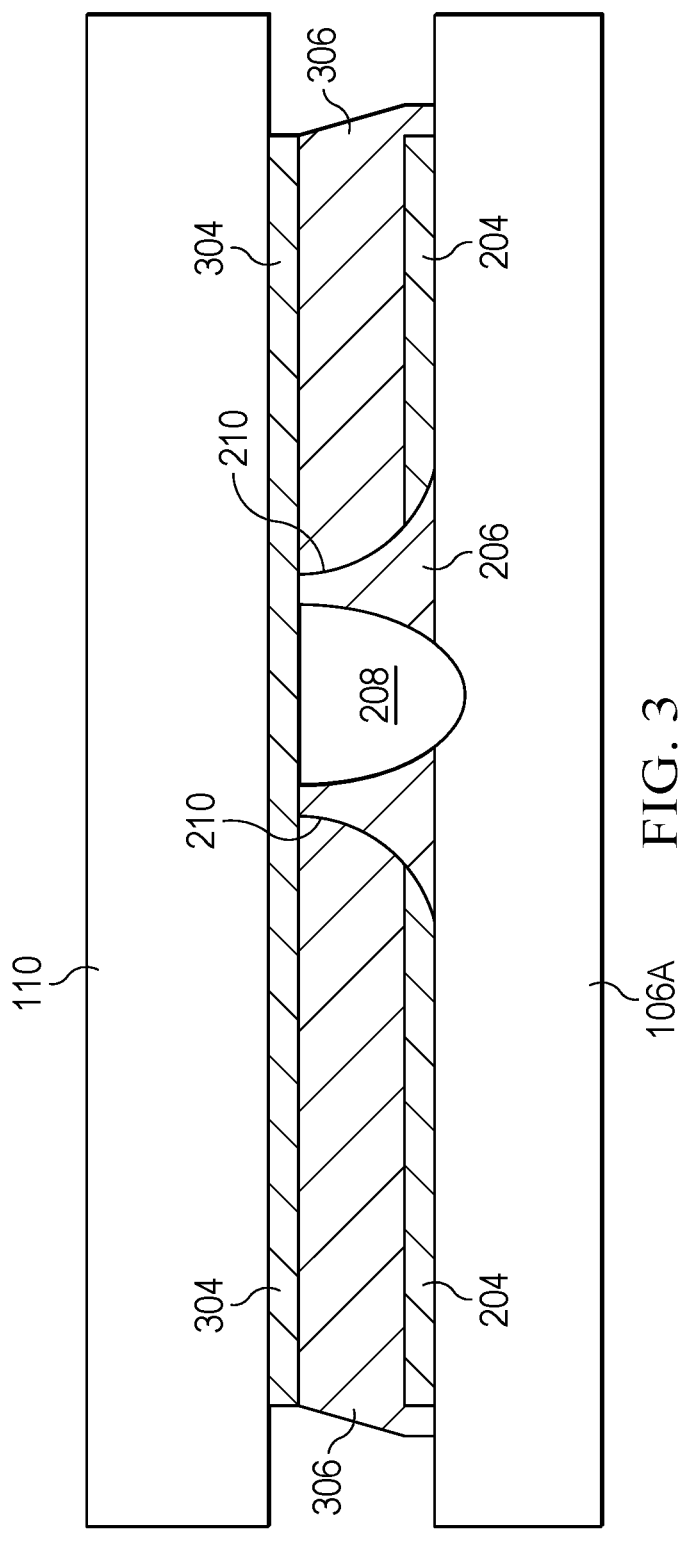
FIG. 3 illustrates a cross-sectional side elevation view of selected components of the example circuit board of FIG. 2 and a circuit package after a solder reflow process to electrically couple the circuit package to the circuit board, in accordance with embodiments of the present disclosure.

FIG. 3 illustrates a cross-sectional side elevation view of selected components of a circuit board 106A and circuit package 110 after a solder reflow process to electrically couple circuit package 110 to circuit board 106A, in accordance with embodiments of the present disclosure. After the solder reflow process, reflowed solder 306 may electrically couple pads 204 of circuit board 106A to corresponding pins 304 of circuit package 110. During and after the solder reflow process, raised perimeter 210 may provide a mechanical standoff between pads 204 and pins 304, which may improve solder joint reliability and/or reduce voids as compared to traditional processes.

Figure 4:
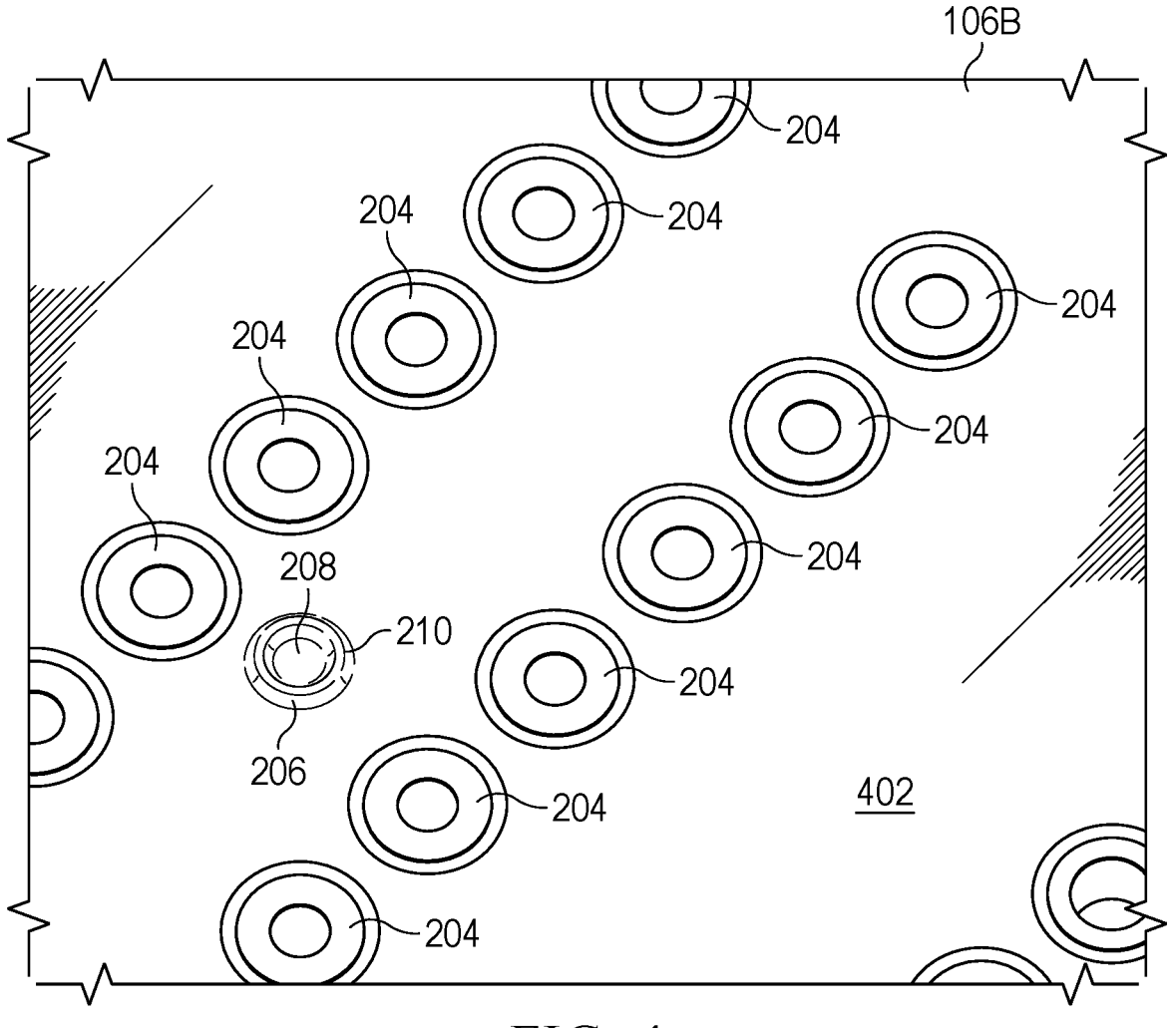
FIG. 4 illustrates a perspective view of selected components of another example circuit board, in accordance with embodiments of the present disclosure.

FIG. 4 illustrates a perspective view of selected components of a circuit board 106B, in accordance with embodiments of the present disclosure. In some embodiments, circuit board 106B depicted in FIG. 4 may be used to implement circuit board 106 shown in FIG. 1.

As shown in FIG. 4, circuit board 106B may include a plurality of pads 204 for electrically coupling circuit packages to circuit board 106B. Also as shown in FIG. 4, circuit board 106B may have a dimple 206 formed on a surface 402 of circuit board 106B. Dimple 206 may have a depression 208 in the center of dimple 206, which may penetrate below surface 402, and a raised perimeter 210 around depression 208, which may be raised above surface 402. In some embodiments, raised perimeter 210 may be raised above surface 402 by between approximately 2.0 mils and 4.0 mils. Although dimple 206 is shown in FIG. 4 as being circular in shape, dimple 206 may have any suitable shape. Further, dimple 206 may have any suitable physical dimensions (e.g., diameter, length, width, height, etc).

Dimple 206 may be formed in any suitable manner upon surface 402. For example, in some embodiments, a mechanical punch tool (e.g., an automatic machine, or a manual tool such as a ball peen hammer and a punch tool) may be used prior to a solder reflow process of circuit board 106B that applies a force to surface 402 sufficient to create depression 208 and raised perimeter 210. A solder reflow process may be used to couple pins of another information handling resource to pads 204, with dimple 206 providing a standoff between such pads 204 and pins.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the figures and described above.

Unless otherwise specifically noted, articles depicted in the figures are not necessarily drawn to scale. All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112 (f) unless the words "means for" or "step for" are explicitly used in the particular claim.

What is claimed is:

1. An information handling resource comprising:
   a circuit board comprising an electrically-conductive pad; and
   a dimple formed on the circuit board, the dimple having a depression surrounded by a raised perimeter raised above a surface of the circuit board, wherein:
      an interior surface defining the depression is curved and a portion of the depression is below the surface of the circuit board;
      an exterior surface of the dimple is concave; and
      a height of the dimple is approximately equal to a distance between the surface of the circuit board and a surface of a circuit package configured to be electrically and mechanically coupled to the circuit board.

2. The information handling resource of claim 1, further comprising:

the circuit package comprising an electrically-conductive pin; and reflowed solder electrically coupling the electrically-conductive pad to the electrically-conductive pin, wherein the reflowed solder mechanically couples to the exterior surface of the dimple.

3. The information handling resource of claim 2, wherein the circuit package is a bottom-terminated component.

4. The information handling resource of claim 1, wherein the raised perimeter is raised between approximately 2 mils and approximately 4 mils above the surface.

5. The information handling resource of claim 1, wherein the dimple is circular in shape.

6. The information handling resource of claim 1, wherein the dimple is formed on a surface of an electrically-conductive pad of the circuit board.

7. The information handling resource of claim 1, wherein the dimple is formed on the surface of the circuit board.

8. An information handling system comprising:

a processor; and an information handling resource comprising:

a circuit board comprising an electrically-conductive pad; and a dimple formed on a surface of the circuit board, the dimple having a depression surrounded by a raised perimeter raised above a surface of the circuit board, wherein:

an interior surface defining the depression is curved and a portion of the depression is below the surface of the circuit board;

an exterior surface of the dimple above the surface of the circuit board is concave; and a height of the dimple is approximately equal to a distance between the surface of the circuit board and a surface of a circuit package configured to be electrically and mechanically coupled to the circuit board.

9. The information handling system of claim 8, further comprising:

the circuit package comprising an electrically-conductive pin; and reflowed solder electrically coupling the electrically-conductive pad to the electrically-conductive pin, wherein the reflowed solder mechanically couples to the exterior surface of the dimple.

10. The information handling system of claim 9, wherein the circuit package is a bottom-terminated component.

11. The information handling system of claim 8, wherein the raised perimeter is raised between approximately 2 mils and approximately 4 mils above the surface.

12. The information handling system of claim 8, wherein the dimple is circular in shape.

13. The information handling system of claim 8, wherein the dimple is formed on a surface of an electrically-conductive pad of the circuit board.

14. The information handling system of claim 8, wherein the dimple is formed on the surface of the circuit board.

15. A method comprising:

forming a circuit board with an electrically-conductive pad; and forming a dimple on the circuit board, the dimple having a depression surrounded by a raised perimeter raised above a surface of the circuit board, wherein;

an interior surface defining the depression is curved and a portion of the depression is below the surface of the circuit board;

an exterior surface of the dimple above the surface of the circuit board is concave; and a height of the dimple is approximately equal to a distance between the surface of the circuit board and a surface of a circuit package configured to be electrically and mechanically coupled to the circuit board.

16. The method of claim 15, further comprising electrically coupling an electrically-conductive pin of the circuit package to the electrically-conductive pad with reflowed solder, wherein the reflowed solder mechanically couples to the exterior surface of the dimple.

17. The method of claim 16, wherein the circuit package is a bottom-terminated component.

18. The method of claim 15, further comprising forming the dimple such that the raised perimeter is raised between approximately 2 mils and approximately 4 mils above the surface.

19. The method of claim 15, further comprising forming the dimple such that the dimple is circular in shape.

20. The method of claim 15, wherein forming the dimple comprises forming the dimple on a surface of an electrically-conductive pad of the circuit board.

21. The method of claim 15, wherein forming the dimple comprises forming the dimple on the surface of the circuit board.

* * * * *